United States Patent
Ishimatsu et al.

(10) Patent No.: US 8,932,716 B2
(45) Date of Patent: Jan. 13, 2015

(54) CONDUCTIVE PARTICLE, AND ANISOTROPIC CONDUCTIVE FILM, BONDED STRUCTURE, AND BONDING METHOD

(75) Inventors: Tomoyuki Ishimatsu, Kanuma (JP); Yuta Araki, Kanuma (JE)

(73) Assignee: Dexerials Corporation, Tokyo (JP)

( * ) Notice: Subject to any disclaimer, the term of this patent is extended or adjusted under 35 U.S.C. 154(b) by 45 days.

(21) Appl. No.: 13/332,555

(22) Filed: Dec. 21, 2011

(65) Prior Publication Data

US 2012/0090882 A1    Apr. 19, 2012

Related U.S. Application Data

(63) Continuation of application No. PCT/JP2010/061790, filed on Jul. 12, 2010.

(30) Foreign Application Priority Data

Jul. 16, 2009    (JP) .................................. 2009-168081

(51) Int. Cl.
 B32B 5/16        (2006.01)
 H05K 3/32        (2006.01)
 B22F 1/02        (2006.01)
 C22C 5/02        (2006.01)
 (Continued)

(52) U.S. Cl.
 CPC    H05K 3/323 (2013.01); B22F 1/02 (2013.01); C22C 5/02 (2013.01); C22C 19/03 (2013.01); H01B 1/02 (2013.01); H05K 2201/0218 (2013.01)

USPC .................... 428/403; 428/328; 428/355 EP; 428/680

(58) Field of Classification Search
 CPC ........ B23B 9/041; B23B 9/048; B23B 11/08; B23B 15/01; B23B 15/092; B23B 17/068; B23B 2255/20; B23B 2264/105; C23C 28/028; C09J 2400/16; C09J 2463/00
 USPC ............. 428/403–407, 323, 328, 355 EP, 680
 See application file for complete search history.

(56) References Cited

U.S. PATENT DOCUMENTS 7,491,445 B2    2/2009 Ishida
2002/0061401 A1    5/2002 Kokubo et al.
(Continued)

FOREIGN PATENT DOCUMENTS

CN    1981348 A    6/2007
CN    101065204 A    10/2007
(Continued)

OTHER PUBLICATIONS

Online machine translation of JP 2007-173075 (2007).*
(Continued)

*Primary Examiner* — Holly Le
(74) *Attorney, Agent, or Firm* — Buchanan, Ingersoll & Rooney PC

(57) ABSTRACT

To provide a conductive particle, containing: a core particle; and a conductive layer formed on a surface of the core particle, wherein the core particle is a nickel particle, and wherein the conductive layer is a nickel plating layer a surface of which has a phosphorous concentration of 10% by mass or lower, and the conductive layer has an average thickness of 1 nm to 10 nm.

13 Claims, 2 Drawing Sheets

(51) Int. Cl.
*C22C 19/03* (2006.01)
*H01B 1/02* (2006.01)

(56) References Cited

U.S. PATENT DOCUMENTS

| 2007/0190349 A1 | 8/2007 | Ishida |
| 2007/0202335 A1 | 8/2007 | Kubota |
| 2007/0281161 A1* | 12/2007 | Ishida ........................... 428/407 |
| 2008/0035244 A1 | 2/2008 | Suzuki et al. |

FOREIGN PATENT DOCUMENTS

| JP | 2002-173702 A | 6/2002 |
| JP | 2004-238738 A | 8/2004 |
| JP | 2006-228475 A | 8/2006 |
| JP | 2006-302716 A | 11/2006 |
| JP | 2006-331714 A | 12/2006 |
| JP | 2007-173075 A | 7/2007 |
| JP | 2007-242307 A | 9/2007 |
| JP | 4235227 B2 | 3/2009 |
| WO | WO 2006/025485 A1 | 3/2006 |

OTHER PUBLICATIONS

International Search Report (PCT/ISA/210) issued on Aug. 17, 2010, by Japanese Patent Office as the International Searching Authority for International Application No. PCT/JP2010/061790.

Written Opinion (PCT/ISA/237) issued on Aug. 17, 2010, by Japanese Patent Office as the International Searching Authority for International Application No. PCT/JP2010/061790.

Written Opinion (PCT/ISA/237) issued on Jun. 28, 2011, by Japanese Patent Office as the International Searching Authority for International Application No. PCT/JP2010/061790.

Office Action issued in corresponding Chinese Patent Application No. 201080032115.9 dated Jan. 2, 2014 with English Translation.

* cited by examiner

CONDUCTIVE PARTICLE, AND ANISOTROPIC CONDUCTIVE FILM, BONDED STRUCTURE, AND BONDING METHOD

CROSS-REFERENCE TO RELATED APPLICATION

This is a continuation of Application No. PCT/JP2010/061790, filed on Jul. 12, 2010.

BACKGROUND OF THE INVENTION

1. Field of the Invention

The present invention relates to conductive particles, as well as an anisotropic conductive film, bonded structure, and bonding method using the conductive particles.

2. Description of the Related Art

To connect circuit members to each other, such as a connection between a liquid crystal display device and a tape carrier package (TCP), a connection between a flexible printed circuit (FPC) and a printed circuit board, or a connection between a FPC and a printed circuit board, a circuit connecting material (e.g., anisotropic conductive adhesive), in which conductive particles are dispersed in an adhesive, is used. In recent years, when a semiconductor silicon chip is mounted on a substrate, in order to connect circuit members to each, so-called "flip chip mounting" is employed in which the semiconductor silicon chip is directly bonded face down on the substrate without using a wire bond. In this flip chip mounting, circuit connecting materials, such as an anisotropic conductive adhesive, are used for connecting circuit members to each other.

The anisotropic conductive film generally contains a binder resin and conductive particles. As the conductive particles, for example, nickel (Ni) based conductive particles have been popular as hardness thereof is high, and a cost can be reduced compared to use of gold (Au) based conductive particles.

As examples of the nickel-based conductive particles, there are (i) conductive particles each of which has a resin core particle, a nickel plating layer formed on a surface of the resin core particle, and protrusions on a surface of the conductive particle (see, for example, Japanese Patent Application Laid-Open (JP-A) No. 2006-302716, Japanese Patent (JP-B) No. 4235227, and JP-A Nos. 2006-228475, 2007-173075), and (ii) conductive particles in each of which surfaces of easily oxidized nickel core particles are plated with gold (see, for example, JP-A No. 2004-238738).

The protrusions formed on surfaces of the conductive particles (i) can realize a firm connection because pressure is concentrated on contact points between the protrusions and a circuit member when circuit members are pressure bonded for conductive connection. Moreover, as the protrusions break the oxidized coating on a surface of the electrode, the connection reliability can be improved.

Since the conductive particles (i) uses a resin, which has elastic deformation characteristics, as a material of the core particles, however, there are cases where the conductive particles (i) cannot break an oxide coating formed on a surface of an electrode of a circuit member depending on the hardness of the circuit board, even though the conductive particles (i) have protrusions on the nickel plating layers. Therefore, there is a problem that the connection reliability is low.

Moreover, in the conductive particles (ii) in which surfaces of the nickel core particles are plated with gold, the gold formed on the surface has low Mohs hardness, i.e., 2.5. Therefore, there are cases where the conductive particles (ii) cannot break an oxide coating on a surface of an electrode of a circuit member, which reduces connection reliability.

BRIEF SUMMARY OF THE INVENTION

The present invention aims to solve the aforementioned various problems in the art, and to achieve the following object. Namely, an object of the present invention is to provide conductive particles capable of prevention aggregations, breaking an oxide coating on a surface of an electrode of a circuit member in the course of a connection between circuit members, and attaining high connection reliability, as well as providing an anisotropic conductive film, bonded structure and bonded method all of which use the aforementioned conductive particles.

The means for solving the aforementioned problems are as follows:

<1> A conductive particle, containing:
   a core particle; and
   a conductive layer formed on a surface of the core particle,
   wherein the core particle is a nickel particle, and
   wherein the conductive layer is a nickel plating layer a surface of which has
   a phosphorous concentration of 10% by mass or lower, and the conductive layer has
   an average thickness of 1 nm to 10 nm.

<2> The conductive particle according to <1>, wherein the surface of the nickel plating layer has a phosphorous concentration of 0.3% by mass to 6% by mass.

<3> The conductive particle according to <2>, wherein the surface of the nickel plating layer has a phosphorous concentration of 0.3% by mass to 1.5% by mass.

<4> The conductive particle according to <3>, wherein the surface of the nickel plating layer has a phosphorous concentration of 0.3% by mass to 0.8% by mass.

<5> The conductive particle according to any one of <1> to <4>, wherein the conductive particle has protrusions at a surface thereof where each protrusion has a pointed edge.

<6> An anisotropic conductive film, containing:
   the conductive particles as defined in any one of <1> to <5>; and
   a binder resin containing an epoxy resin, an acrylate resin, and both the epoxy resin and the acrylate resin.

<7> The anisotropic conductive film according to <6>, further containing at least one selected from the group consisting of a phenoxy resin, an unsaturated polyester resin, a saturated polyester resin, and a urethane resin.

<8> The anisotropic conductive film according to any of <6> or <7>, further containing a latent curing agent.

<9> The anisotropic conductive film according to any one of <6> to <8>, further containing a silane coupling agent.

<10> A bonded structure, containing:
   a first circuit member containing an electrode;
   a second circuit member containing an electrode, provided so as to face the first circuit member; and
   the anisotropic conductive film as defined in any one of <6> to <9>, provided between the first circuit member and the second circuit member,
   wherein the electrode of the first circuit member and the electrode of the second circuit member are electrically connected via the conductive particles.

<11> The bonded structure according to <10>, wherein the first circuit member is a flexible circuit board, and the second circuit member is a printed wiring board.

<12> The bonded structure according to <11>, wherein the electrode of the printed wiring board has indentations formed by embedding the conductive particles.
<13> A bonding method, containing:
bonding the anisotropic conductive film as defined in any one of <6> to <9>, with a first circuit member containing an electrode, or a second circuit member containing an electrode;
aligning the first circuit member and the second circuit member for positioning; and
electrically connecting the electrode of the first circuit member and the electrode of the second circuit member together via the conductive particles.
<14> The bonding method according to <13>, wherein the first circuit member is a flexible circuit board, and the second circuit member is a printed wiring board.

The present invention can solve the aforementioned various problems in the art, achieve the aforementioned object, and provide conductive particles capable of prevention aggregations, breaking an oxide coating on a surface of an electrode of a circuit member in the course of a connection between circuit members, and attaining high connection reliability, as well as an anisotropic conductive film, bonded structure and bonded method all of which use the aforementioned conductive particles.

Figure 1:
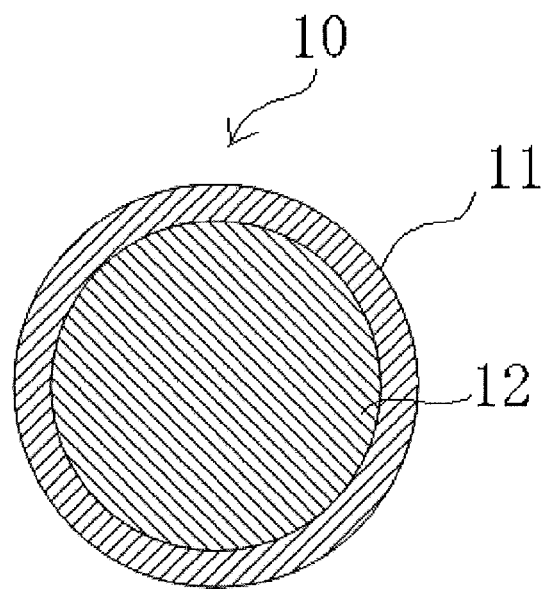
FIG. 1 is a cross-sectional diagram of the conductive particle of the present invention (part 1).

DETAILED DESCRIPTION OF THE INVENTION (Conductive Particles)

The conductive particle of the present invention contains at least a core particle, and a conductive layer, and may further contain protrusions, as desired.

The conductive particle of the present invention may be also used as a group of particles, which may be referred to as "conductive particles of the present invention" hereinafter.

<Core Particle>

The core particle is appropriately selected depending on the intended purpose without any restriction, provided that it is a nickel particle.

—Nickel Particle—

The nickel particle is appropriately selected depending on the intended purpose without any restriction.

A shape of the nickel particle is appropriately selected depending on the intended purpose without any restriction, but it is preferred that a surface configuration of the nickel particle have fine protrusions, because a connecting area increases so that high electric current can be passed through.

A structure of the nickel particle is appropriately selected depending on the intended purpose without any restriction.

The average particle diameter of the nickel particles is appropriately selected depending on the intended purpose without any restriction, but it is preferably 1 μm to 50 μm, more preferably 2 μm to 20 μm, and even more preferably 5 μm to 10 μm.

When the average particle diameter thereof is smaller than 1 μm, or larger than 50 μm, a sharp particle size distribution of the nickel particles may not be attained, which is not practical as practical use thereof is industrial production. Conversely, when the average particle diameter of the nickel particles is within the aforementioned even more preferable range, it is advantageous because it is possible to perform an indentation test (FIG. 4 mentioned later) after connecting the PWB and the FPC.

Note that, the average particle diameter of the nickel particles is a number average particle diameter thereof, and is measured, for example, by a particle size analyzer (Mictortac MT3100, manufactured by Nikkiso Co., Ltd.).

A material of the nickel particle is appropriately selected depending on the intended purpose without any restriction, and examples thereof include pure nickel, and impurities-containing nickel. The impurities are appropriately selected depending on the intended purpose without any restriction, and they may be organic or inorganic materials. Examples thereof include phosphorous, boron, and carbon.

<Conductive Layer>

The conductive layer is appropriately selected depending on the intended purpose without any restriction, provided that it is formed on a surface of the core particle, and it is a nickel plating layer having a phosphorous concentration of 10% by mass or lower at a surface thereof, and the average thickness of 1 nm to 10 nm.

A nickel plating method for forming a nickel plating layer serving as the conductive layer is appropriately selected depending on the intended purpose without any restriction, and examples thereof include electroless plating, and sputtering. In accordance with the nickel plating method, protrusions, which will be mentioned later, can be formed at the same time.

The crystallinity of the conductive layer increases, as the phosphorous concentration at the surface of the conductive layer (the nickel plating layer) decreases, which lead to high conductivity, and high hardness. Therefore, the surface of the conductive particle is difficult to be oxidized. Accordingly, when the phosphorous concentration at the surface of the conductive layer (the nickel plating layer) is low, high connection reliability is attained in the connection between circuit members via the conductive particles.

The phosphorous concentration at the surface of the conductive layer (the nickel plating layer) is appropriately selected depending on the intended purpose without any restriction, provided that it is 10% by mass or lower. The phosphorous concentration at the surface of the conductive layer (the nickel plating layer) is preferably 0.3% by mass to 6% by mass, more preferably 0.3% by mass to 1.5% by mass, and even more preferably 0.3% by mass to 0.8% by mass.

Note that, the phosphorous concentration of the conductive layer (the nickel plating layer) is not limited as long as the phosphorous concentration at the surface thereof is 10% by mass or lower, and the conductive layer (the nickel plating layer) may have a gradient in the phosphorous concentration therein. For example, there is no problem even when the phosphorous concentration of the conductive layer at the side of the core particle is 15% by mass, as long as the phosphorous concentration at the surface of the conductive layer (the nickel plating layer) is 10% by mass or lower.

When the phosphorous concentration at the surface of the conductive layer (the nickel plating layer) is 10% by mass or lower, the conductivity and hardness of the conductive layer become high, and therefore the resulting conductive particles provide excellent connection reliability with respect to an electrode (wiring) having an oxidized film for a long period, and the surface of the resulting conductive particle is difficult to be oxidized. Conversely, when the phosphorous concentration at the surface of the conductive layer (the nickel plating layer) is higher than 10% by mass, the resulting conductive film tends to have high spreading properties, and therefore it may not be able to obtain low connection resistance with respect to an electrode (wiring) having an oxidized film.

Moreover, plating can be regularly performed when the phosphorous concentration at the surface of the conductive layer (the nickel plating layer) is 0.3% by mass or higher, and desirable crystallinity of nickel can be attained when the phosphorous concentration at the surface of the conductive layer is 6% by mass or lower. Therefore, such conductive layer is advantageous. Furthermore, when the phosphorous concentration at the surface of the conductive layer (the nickel plating layer) is within the aforementioned particularly preferable range, it is advantageous because high connection reliability can be attained.

A method for adjusting the phosphorous concentration at the surface of the conductive layer (the nickel plating layer) is appropriately selected depending on the intended purpose without any restriction, and examples thereof include a method for controlling pH of a plating reaction, and a method for controlling a phosphoric acid concentration in a nickel-plating solution.

Among them, the method for controlling pH of the plating reaction is preferable as the method has excellent control over the reaction.

Note that, the phosphorous concentration at the surface of the conductive layer can be measured, for example, by energy dispersion X-ray analysis instrument (product name: FAE-MAX-7000, manufactured by HORIBA, Ltd.).

The average thickness of the conductive layer is appropriately selected depending on the intended purpose without any restriction, provided that it is in the range of 1 nm to 10 nm.

When the average thickness thereof is less than 1 nm, the core particles may not be prevented from being oxidized. When the average thickness thereof is more than 10 nm, the particles tend to aggregate to each other due to plating, which tends to form large particles.

When the average thickness of the conductive layer is 10 nm or less, high connection reliability and be secured, aggregation of plating particles can be avoided during the formation of a conductive layer, to thereby prevent formation of connected plated particles in which two to three particles are connected together, preventing occurrences of short circuit.

Moreover, the conductive particle having the nickel particle as the core particle can have a nickel plating layer, which can be formed as the conductive layer more thinly than the conductive layer formed on a resin particle used as the core particle of the conductive particle.

Note that, the average thickness of the conductive layer is a thickness obtained by randomly selecting and measuring each conductive layer of 10 conductive particles, for example, by polishing the cross-section thereof by means of a focused ion beam system (product name: FB-2100, manufactured by Hitachi High-Technologies Corporation), and measuring by a transmission electron microscope (product name: H-9500, manufactured by Hitachi High-Technologies Corporation), and obtaining arithmetic mean of the measurement values.

In order to attain high connection reliability, it is desired that the core particle has high hardness, the plating layer has high conductivity, and the plating layer is not peeled from the core particle.

The conductive particles of the present invention each use a nickel particle of high hardness as the core particle, and each contain the conductive layer which has high conductivity, and is a phosphorous-containing nickel plating layer having high binding ability to the nickel particle. Accordingly, high connection reliability can be attained.

Moreover, in the case where the core particle of the conductive particle is a resin particle, or a metal particle other than nickel, the conductive layer tends to be peeled off from the core particle as it is compressed. However, the binding ability between the core particle and the conductive layer can be enhanced because the conductive particles of the present invention each contain the core particle and the conductive layer both of which contain nickel, and the conductive layer can be formed thinly.

Figure 2:
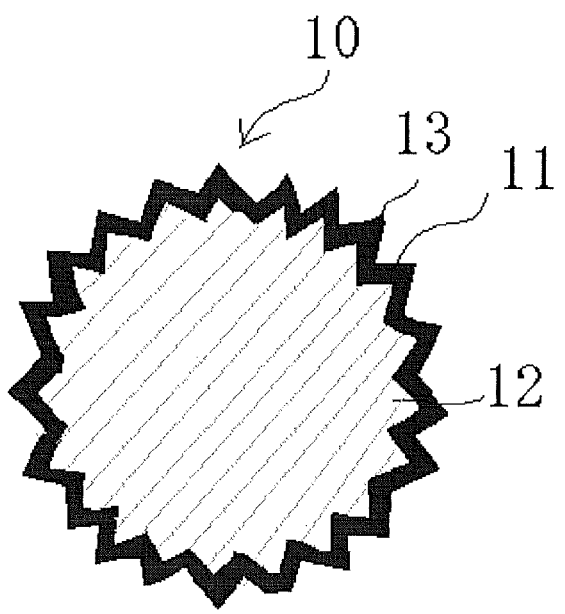
FIG. 2 is a cross-sectional diagram of the conductive particle of the present invention (part 2).

The conductive particle of the present invention will be explained with reference to FIGS. 1 and 2 hereinafter. As the conductive particle 10, there are, for example, the conductive particle 10 (FIG. 1) which contains a nickel particle 12, and a conductive layer 11 which is formed on a surface of the nickel particle 12, has a phosphorous concentration of 10% by mass or lower, and is formed of a nickel plating layer having the average thickness of 1 nm to 10 nm, and the conductive particle 10 (FIG. 2) which further contains protrusions 13 on the surface of the conductive particle 10. The protrusions each preferably have a pointed edge.

(Anisotropic Conductive Film)

The anisotropic conductive film of the present invention contains at least the conductive particles of the present invention, and a binder resin, preferably a latent curing agent, a solid resin at atmospheric temperature, a silane coupling agent, and may further contain appropriately selected other components, as desired.

<Binder Resin>

The binder resin is appropriately selected depending on the intended purpose without any restriction, provided that the binder resin contains an epoxy resin and/or an acrylate resin. The binder resin is preferably a thermoset resin, a photocuring resin, or the like. Note that, in the case where the binder resin is a thermoplastic resin, the binder resin cannot securely include conductive particles therein, degrading the connection reliability.

—Epoxy Resin—

The epoxy resin is appropriately selected depending on the intended purpose without any restriction, and examples thereof include a bisphenol A epoxy resin, a bisphenol F epoxy resin, a novolak epoxy resin, modified epoxy resins thereof, and an alicyclic epoxy resin. These may be used independently, or in combination.

—Acrylate Resin—

The acrylate resin is appropriately selected depending on the intended purpose without any restriction, and examples thereof include methylacrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, and urethane acrylate. These may be used independently, or in combination.

Moreover, as the acrylate resin, methacrylates where the aforementioned acrylates are replaced with methacrylates may be also used, and these may be used independently, or in combination.

<Latent Curing Agent>

The latent curing agent is appropriately selected depending on the intended purpose without any restriction, and examples thereof include a latent curing agent capable of being activated with application of heat, and a latent curing agent capable of generating free radicals with application of heat.

The latent curing agent of being activated with application of heat is appropriately selected depending on the intended purpose without any restriction, and examples thereof include an anionic curing agent (e.g., polyamine, and imidazole), and a cationic curing agent (e.g., a sulfonium salt).

The latent curing agent capable of generating free radicals is appropriately selected depending on the intended purpose without any restriction, and examples thereof include organic peroxide, and an azo compound.

<Solid Resin at Atmospheric Temperature>

The solid resin at atmospheric temperature is appropriately selected depending on the intended purpose without any restriction, and examples thereof include a phenoxy resin, an unsaturated polyester resin, a saturated polyester resin, and a urethane resin.

An amount of the solid resin at atmospheric temperature is appropriately selected depending on the intended purpose without any restriction, but it is preferably 10% by mass to 80% by mass relative to the anisotropic conductive film. When the amount of the solid resin at atmospheric temperature is smaller than 10% by mass relative to the anisotropic conductive film, film forming properties become insufficient, which may cause blocking as the resulting anisotropic conductive film is formed into a film reel. When the amount thereof is larger than 80% by mass, the resulting film has low tackiness, and may fail to adhered to a circuit member.

<Silane Coupling Agent>

The silane coupling agent is appropriately selected depending on the intended purpose without any restriction, and examples thereof include an epoxy-based silane coupling agent, and an acryl-based silane coupling agent. As the silane coupling agent, an alkoxy silane derivative is typically used.

(Bonded Structure)

The bonded structure of the present invention contains a first circuit member, a second circuit member facing the first circuit member, and the anisotropic conductive film of the present invention provided between the first circuit member and the second circuit member, and an electrode of the first circuit member and an electrode of the second circuit member are electrically connected to each other via the conductive particles.

Since the conductive particles of the present invention have high hardness, the conductive particles are embedded in (sink in) an electrode of the second circuit member (e.g., printed wiring board). As a result, indentations of the conductive particles are left on the electrode of the second circuit member.

—First Circuit Member—

The first circuit member is appropriately selected depending on the intended purpose without any restriction, and examples thereof include a flexible printed circuit (FPC) board, and a printed wiring board (PWB). Among them, the FPC board is preferable.

—Second Circuit Member—

The second circuit member is appropriately selected depending on the intended purpose without any restriction, and examples thereof include a flexible printed circuit (FPC) board, a chip on film (COF) board, TCP substrate, a printed wiring board (PWB), IC substrate, and a panel. Among them, the PWB is preferable.

(Bonding Method)

The bonding method of the present invention contains at least a film bonding step, an aligning step, and a connecting step, and may further contain appropriately selected other steps, as desired.

—Film Bonding Step—

The film bonding step is bonding the anisotropic conductive film of the present invention with a first circuit member or second circuit member.

—Aligning Step—

The aligning step is aligning the first circuit member or second circuit member to which the anisotropic conductive film has been bonded, and another circuit member (i.e., the second circuit member or first circuit member) to which the anisotropic conductive film has not been bonded, so that corresponding terminals (electrode) are faced each other, for positioning.

—Connecting Step—

The connecting step is electrically connecting the electrode of the first circuit member and the electrode of the second circuit member via the conductive particles.

—Other Steps—

Other steps are appropriately selected depending on the intended purpose without any restriction.

EXAMPLES

Examples of the present invention will be explained hereinafter, but these Examples shall not be construed as to limit the scope of the present invention in any way.

Comparative Example 1

Preparation of Conductive Particles

Ten grams of methacryl resin particles (product name: EPOSTAR YS48, manufactured by Nippon Shokubai Co., Ltd.) having the average particle diameter of 4.8 μm were subjected to alkali etching with a 5% by weight sodium hydroxide aqueous solution, neutralization with acid, and sensitizing in tin dichloride solution. Thereafter, the resulting particles were subjected pretreatment of electroless plating, including activating in a palladium dichloride solution, followed by filtration, and washing, to thereby obtain resin particles on each surface of which palladium has been deposited.

The obtained resin particles were diluted with 1,500 mL of water, and to this, 0.005 mmol of bismuth nitrate and 0.006 mmol of thallium nitrate were added as a plating stabilizer. The pH of the resulting mixture was adjusted to 5.7 with a 10% by mass sulfuric acid aqueous solution and a 2N sodium hydroxide solution, to thereby form slurry. The temperature of the slurry was controlled to 26° C.

To this slurry, a plating liquid for a first half reaction containing 40 mL of 450 g/L nickel sulfate solution, 80 mL of a mixed solution of sodium hypophosphite (150 g/L) and sodium citrate (116 g/L), 280 mL of water, and as a plating stabilizer, 0.02 mmol of bismuth nitrate and 0.024 mmol of thallium nitrate, and the pH of which had been adjusted to 9.3 with a 28% by weight, was added through a constant rate pump at the feeding rate of 80 mL/min.

The mixture was stirred until the pH was stabilized, and after confirming the termination of bubbling by hydrogen, first electroless plating was performed.

Subsequently, a plating liquid for a second half reaction containing 180 mL of a 450 g/L nickel sulfate solution, 440 mL of a mixed solution of sodium hypophosphite (150 g/L) and sodium citrate (116 g/L), and as a plating stabilizer, 0.3 mmol of bismuth nitrate and 0.36 mmol of thallium nitrate was added through a constant rate pump at the feeding rate of 27 mL/min.

Thereafter, the mixture was stirred until the pH was stabilized, and after confirming the termination of bubbling by hydrogen, second electroless plating was performed.

Subsequently, the plating liquid was filtered, and the resulting filtrate was washed with water, followed by drying by means of a vacuum drier at 80° C. to thereby yield nickel-plated resin particles having a nickel plating layer having protrusion on a surface thereof.

Note that the average particle diameter of the methacryl resin particles was measured by means of a particle size analyzer (Mictortac MT3100, manufactured by Nikkiso Co., Ltd.).

<Evaluation of Conductive Particle>

The obtained conductive particles were sliced, and a cross-section of each particles was polished by means of a focused ion beam system (product name: FB-2100, manufactured by Hitachi High-Technologies Corporation), and a thickness of the conductive layer was measured by means of a transmission electron microscope (product name: H-9500, manufactured by Hitachi High-Technologies Corporation). Moreover, the phosphorous concentration of the outer surface of the nickel plating layer was measured by means of an energy dispersion X-ray analysis instrument (product name: FAE-MAX-7000, manufactured by HORIBA, Ltd.). The results are depicted in Table 1.

<Preparation of Anisotropic Conductive Film>

The obtained conductive particles were dispersed in a thermocurable binder containing 50 parts by a microcapsule amine-based curing agent (product name: Novacure HX3941HP, manufactured by Asahi Chemical Industry Co., Ltd), 14 parts of a liquid epoxy resin (product name: EP828, manufactured by Japan Epoxy Resin Co., Ltd.), 35 parts of a phenoxy resin (product name: YP50, manufactured by Toto Kasei Co., Ltd.), and 1 part of a silane coupling agent (product name: KBE403, manufactured by Shin-Etsu Chemical Co., Ltd.) to thereby give the volume ratio of 10%, and the resulting dispersion was applied on a silicon-treated release PET film to give a thickness of 20 μm, and a thickness of 35 μm, to thereby prepare a sheet-shaped anisotropic conductive film.

<Production of Bonded Structure 1>

A COF (200 μm-pitched (Line/Space=1/1), Cu (8 μm-thick)-Sn plated, 38 μm-thick S'perflex base) for evaluation and a chrome/aluminum coating glass (a glass sheet coating with chrome as a surface layer, and aluminum as an undercoat, a thickness of a base: 1.1 mm) for evaluation were bonded using the prepared 20 μm-thick anisotropic conductive film. At first, the anisotropic conductive film slit into a width of 1.5 mm was bonded to the chrome/aluminum coating glass for evaluation, followed by positioning and placing the COF for evaluation thereon. The resulting laminate was bonded by pressure bonding using a 70 μm-thick Teflon (registered trademark) as a buffer material and a heating tool having a width of 1.5 mm, at 190° C. and at 3 MPa for 10 seconds, to thereby produce Bonded Structure 1.

<Evaluation of Bonded Structure 1>

The produced Bonded Structure 1 was subjected a measurement of connection resistance (Ω) with the application of electric current (1 mA), at the initial stage, and after a reliability test (treating for 500 hours at the temperature of 85° C., humidity of 85%) in accordance with a 4-terminal sensing method. The results are depicted in Table 3.

<Production of Bonded Structure 2>

A COF (200 μm-pitched (Line/Space=1/1), Cu (8 μm-thick)-Sn plated, 38 μm-thick S'perflex base) for evaluation and a PWB (200 μm-pitched (Line/Space=1/1), Cu (35 μm-thick)-Au plated, FR-4 base) for evaluation were bonded using the prepared 35 μm-thick anisotropic conductive film. At first, the anisotropic conductive film slit into a width of 1.5 mm was bonded to the PWB for evaluation, followed by positioning and placing the COF for evaluation thereon. The resulting laminate was bonded by pressure bonding using a 250 μm-thick silicon rubber as a buffer material and a heating tool having a width of 1.5 mm, at 190° C. and at 3 MPa for 10 seconds, to thereby produce Bonded Structure 2.

<Evaluation of Bonded Structure 2>

The produced Bonded Structure 2 was subjected a measurement of connection resistance (Ω) with the application of electric current (1 mA), at the initial stage, and after a reliability test (treating for 500 hours at the temperature of 85° C., humidity of 85%) in accordance with a 4-terminal sensing method. The results are depicted in Table 4.

Bonded Structure 2 was observed under a metal microscope (product name: MX51, manufactured by Olympus Corporation) to determine whether or not there were any indentations left on the electrode of the PWB for evaluation by the particles captured between the electrodes. The result is presented in FIG. 3.

Comparative Example 2

In the same manner as in Comparative Example 1, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that the conductive particles were prepared in the following manner. The results are depicted in Tables 1, 3, and 4.

<Preparation of Conductive Particles>

Gold-plated nickel particles were prepared by electroless plating nickel particles (product name: Nickel powder 123, manufactured by NIKKO RICA CORPORATION) having the average particle diameter of 5.0 μm in the method described in JP-A No. 2004-238738. Note that, the average particle diameter of the nickel particles was measured by means of a particle size analyzer (Mictortac MT3100, manufactured by Nikkiso Co., Ltd.).

Example 1

In the same manner as in Comparative Example 1, the evaluation of the conductive particles, the preparation of the anisotropic conductive film, the production of Bonded Structure 1, the evaluation of Bonded Structure 1, the preparation of Bonded Structure 2, the evaluation of Bonded Structure 2, and the observation of Bonded Structure 2 to determine the presence of indentations were carried out, provided that the conductive particles were prepared in the following manner. The results are depicted in Tables 1, 3, and 4, and presented in FIG. 4.

<Preparation of Conductive Particles>

Nickel particles (product name: Nickel powder 123, manufactured by NIKKO RICA CORPORATION) having true specific gravity of 8.9 and the average particle diameter of 5.0 μm were added to a thallium nitrate aqueous solution, and nickel plating was performed by adding a mixed solution of nickel sulfate, sodium hypophosphite, sodium citrate, and thallium nitrate, the pH of which had been adjusted to the predetermined value with ammonium water or sulfuric acid, at the feeding rate of 30 mL/min, while stirring at 60° C. The resulting plating liquid was filtered, and the filtrate was washed with pure water, followed by drying by means of a vacuum drier at 80° C., to thereby yield nickel-plated nickel particles A each having a nickel plating layer a surface of which had a phosphorous concentration of 0.3% by mass.

Example 2

In the same manner as in Example 1, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that a mixing ratio of nickel sulfate, sodium hypophosphite, sodium citrate, and thallium nitrate in the mixed solution was changed to yield nickel-plated nickel particles B each having a nickel plating layer a surface of which had a phosphorous concentration of 2.3% by mass. The results are depicted in Tables 1, 3, and 4.

Example 3

In the same manner as in Example 1, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that a mixing ratio of nickel sulfate, sodium hypophosphite, sodium citrate, and thallium nitrate in the mixed solution was changed to yield nickel-plated nickel particles C each having a nickel plating layer a surface of which had a phosphorous concentration of 6.9% by mass. The results are depicted in Tables 1, 3, and 4.

Example 4

In the same manner as in Example 1, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that a mixing ratio of nickel sulfate, sodium hypophosphite, sodium citrate, and thallium nitrate in the mixed solution was changed to yield nickel-plated nickel particles D each having a nickel plating layer a surface of which had a phosphorous concentration of 9.7% by mass. The results are depicted in Tables 1, 3, and 4.

Comparative Example 3

In the same manner as in Example 1, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that a mixing ratio of nickel sulfate, sodium hypophosphite, sodium citrate, and thallium nitrate in the mixed solution was changed to yield nickel-plated nickel particles E each having a nickel plating layer a surface of which had a phosphorous concentration of 10.4% by mass. The results are depicted in Tables 1, 3, and 4.

Comparative Example 4

In the same manner as in Example 1, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that a mixing ratio of nickel sulfate, sodium hypophosphite, sodium citrate, and thallium nitrate in the mixed solution was changed to yield nickel-plated nickel particles F each having a nickel plating layer a surface of which had a phosphorous concentration of 17.3% by mass. The results are depicted in Tables 1, 3, and 4.

Example 5

In the same manner as in Example 1, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that a mixing ratio of nickel sulfate, sodium hypophosphite, sodium citrate, and thallium nitrate in the mixed solution, and the amount of the mixed solution were changed to yield nickel-plated nickel particles G each having a nickel plating layer having a thickness of 4 nm, a surface of which had a phosphorous concentration of 5.0% by mass. The results are depicted in Tables 1, 3, and 4.

Further, the particle size distribution of the produced nickel-plated nickel particles was measured. The results are depicted in Table 2.

Example 6

In the same manner as in Example 5, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that the amount of the mixed solution was changed to yield nickel-plated nickel particles H each having a nickel plating layer having a thickness of 8 nm, a surface of which had a phosphorous concentration of 5.0% by mass. The results are depicted in Tables 1, 3, and 4.

Further, the particle size distribution of the produced nickel-plated nickel particles was measured. The results are depicted in Table 2.

Example 7

In the same manner as in Example 5, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that the amount of the mixed solution was changed to yield nickel-plated nickel particles I each having a nickel plating layer having a thickness of 10 nm, a surface of which had a phosphorous concentration of 5.1% by mass. The results are depicted in Tables 1, 3, and 4.

Further, the particle size distribution of the produced nickel-plated nickel particles was measured. The results are depicted in Table 2.

Comparative Example 5

In the same manner as in Example 5, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that the amount of the mixed solution was changed to yield nickel-plated nickel particles J each having a nickel plating layer having a thickness of 28 nm, a surface of which had a phosphorous concentration of 5.1% by mass. The results are depicted in Tables 1, 3, and 4.

Further, the particle size distribution of the produced nickel-plated nickel particles was measured. The results are depicted in Table 2.

Comparative Example 6

In the same manner as in Example 5, the evaluation of the conductive particles, the preparation of the anisotropic conductive film, the production of Bonded Structure 1, the evaluation of Bonded Structure 1, the preparation of Bonded Structure 2, and the evaluation of Bonded Structure 2 were carried out, provided that the amount of the mixed solution was changed to yield nickel-plated nickel particles K each having a nickel plating layer having a thickness of 34 nm, a surface of which had a phosphorous concentration of 5.3% by mass. The results are depicted in Tables 1, 3, and 4.

Further, the particle size distribution of the produced nickel-plated nickel particles was measured. The results are depicted in Table 2.

TABLE 1

|  | Conductive particle | Plating thickness (nm) | Phosphorous concentration (% by mass) |
|---|---|---|---|
| Comp. Ex. 1 | Nickel-plated resin particles | 95 | 9.7 |
| Comp. Ex. 2 | Gold-plated nickel particles | 17 | — |
| Ex. 1 | Nickel-plated nickel particles A | 10 | 0.3 |
| Ex. 2 | Nickel-plated nickel particles B | 10 | 2.3 |
| Ex. 3 | Nickel-plated nickel particles C | 10 | 6.9 |
| Ex. 4 | Nickel-plated nickel particles D | 10 | 9.7 |
| Comp. Ex. 3 | Nickel-plated nickel particles E | 10 | 10.4 |
| Comp. Ex. 4 | Nickel-plated nickel particles F | 10 | 17.3 |
| Ex. 5 | Nickel-plated nickel particles G | 4 | 5.0 |
| Ex. 6 | Nickel-plated nickel particles H | 8 | 5.0 |
| Ex. 7 | Nickel-plated nickel particles I | 10 | 5.1 |
| Comp. Ex. 5 | Nickel-plated nickel particles J | 28 | 5.1 |
| Comp. Ex. 6 | Nickel-plated nickel particles K | 34 | 5.3 |

TABLE 2

|  | Conductive particle | Particle size distribution [μm] Max | Min | Ave |
|---|---|---|---|---|
| — | Nickel particles before plating (Niche powder 123, of NIKKO RICA CORPORATION) | 15.6 | 1.5 | 5.0 |
| Ex. 5 | Nickel-plated nickel particles G | 15.6 | 1.5 | 5.0 |
| Ex. 6 | Nickel-plated nickel particles H | 15.6 | 1.5 | 5.0 |
| Ex. 7 | Nickel-plated nickel particles I | 15.6 | 1.5 | 5.0 |
| Comp. Ex. 5 | Nickel-plated nickel particles J | 18.5 | 1.5 | 5.3 |
| Comp. Ex. 6 | Nickel-plated nickel particles K | 41.1 | 1.5 | 6.1 |

TABLE 3

| | | Connection resistance (Ω) of COF/aluminum coating glass | | | | | |
|---|---|---|---|---|---|---|---|
| | | Initial | | | After reliability test (85° C./85%/500 h) | | |
| | Conductive particle | Max | Min | Ave | Max | Min | Ave |
| Comp. Ex. 1 | Nickel-plated resin particles | 2.8 | 1.0 | 2.1 | 3.3 | 1.9 | 2.9 |
| Comp. Ex. 2 | Gold-plated nickel particles | 3.4 | 1.6 | 2.1 | 49.2 | 8.3 | 27.5 |
| — | Nickel particles before plating (Niche powder 123, of NIKKO RICA CORPORATION) | 43.4 | 5.9 | 21.8 | ∞ | — | — |
| Ex. 1 | Nickel-plated nickel particles A | 1.1 | 0.8 | 0.9 | 1.4 | 1.0 | 1.2 |
| Ex. 2 | Nickel-plated nickel particles B | 1.3 | 0.8 | 1.0 | 1.6 | 1.0 | 1.5 |
| Ex. 3 | Nickel-plated nickel particles C | 2.0 | 0.9 | 1.5 | 2.8 | 1.4 | 2.3 |
| Ex. 4 | Nickel-plated nickel particles D | 2.3 | 0.9 | 1.8 | 3.5 | 1.6 | 2.8 |
| Comp. Ex. 3 | Nickel-plated nickel particles E | 3.1 | 1.0 | 2.3 | 6.3 | 1.9 | 4.7 |
| Comp. Ex. 4 | Nickel-plated nickel particles F | 8.3 | 1.3 | 4.9 | 21.0 | 3.5 | 14.6 |
| Ex. 5 | Nickel-plated nickel particles G | 1.3 | 0.8 | 1.0 | 1.9 | 1.2 | 1.4 |
| Ex. 6 | Nickel-plated nickel particles H | 1.6 | 0.9 | 1.2 | 2.2 | 1.3 | 1.6 |
| Ex. 7 | Nickel-plated nickel particles I | 1.8 | 0.9 | 1.3 | 2.4 | 1.3 | 1.8 |
| Comp. Ex. 5 | Nickel-plated nickel particles J | 2.2 | 0.9 | 1.6 | 2.6 | 1.4 | 1.9 |
| Comp. Ex. 6 | Nickel-plated nickel particles K | 2.2 | 0.9 | 1.6 | 2.9 | 1.4 | 1.9 |

TABLE 4

| | | Connection resistance (Ω) of COF/PWB | | | | | |
|---|---|---|---|---|---|---|---|
| | | Initial | | | After reliability test (85° C./85%/500 h) | | |
| | Conductive particle | Max | Min | Ave | Max | Min | Ave |
| Comp. Ex. 1 | Nickel-plated resin particles | 0.55 | 0.29 | 0.35 | 3.33 | 0.31 | 1.09 |
| Comp. Ex. 2 | Gold-plated nickel particles | 0.34 | 0.29 | 0.31 | 0.43 | 0.32 | 0.35 |
| — | Nickel particles before plating (Niche powder 123, of NIKKO RICA CORPORATION) | 0.98 | 0.33 | 0.53 | 5.93 | 0.45 | 3.87 |
| Ex. 1 | Nickel-plated nickel particles A | 0.34 | 0.29 | 0.31 | 0.36 | 0.31 | 0.33 |
| Ex. 2 | Nickel-plated nickel particles B | 0.34 | 0.29 | 0.31 | 0.37 | 0.31 | 0.33 |
| Ex. 3 | Nickel-plated nickel particles C | 0.34 | 0.29 | 0.31 | 0.43 | 0.32 | 0.35 |
| Ex. 4 | Nickel-plated nickel particles D | 0.34 | 0.29 | 0.31 | 0.43 | 0.32 | 0.35 |
| Comp. Ex. 3 | Nickel-plated nickel particles E | 0.37 | 0.29 | 0.32 | 0.43 | 0.32 | 0.35 |
| Comp. Ex. 4 | Nickel-plated nickel particles F | 0.50 | 0.42 | 0.38 | 0.43 | 0.32 | 0.35 |
| Ex. 5 | Nickel-plated nickel particles G | 0.34 | 0.29 | 0.31 | 0.40 | 0.32 | 0.33 |
| Ex. 6 | Nickel-plated nickel particles H | 0.34 | 0.29 | 0.31 | 0.41 | 0.32 | 0.33 |
| Ex. 7 | Nickel-plated nickel particles I | 0.34 | 0.29 | 0.31 | 0.41 | 0.32 | 0.33 |
| Comp. Ex. 5 | Nickel-plated nickel particles J | 0.34 | 0.29 | 0.31 | 0.41 | 0.32 | 0.33 |
| Comp. Ex. 6 | Nickel-plated nickel particles K | 0.34 | 0.29 | 0.31 | 0.41 | 0.32 | 0.33 |

From the results depicted in Table 2, it was found that the nickel-plated nickel particles J in each of which the nickel plating layer having a thickness of 28 nm had been formed had slightly bigger particle diameters than the diameters of nickel particles before the processing.

From the results depicted in Table 2, moreover, it was found that aggregations of the particles occurred when the nickel plating layer was thick such as in the nickel-plated nickel particles J and K, which lead to large particle diameters of the resulting conductive particles. Particularly, the nickel-plated nickel particles K in each of which the nickel plating layer having a thickness of 34 nm had been formed had the maximum particle diameter (41.1 µm) that was twice or larger than the size of the nickel particles before the processing, which resulted in a broad particle size distribution of the resulting conductive particles, causing short circuit due to the aggregation of the particles.

From the results depicted in Table 3, it was found that, in the case where the circuit member was connected with the glass substrate, the gold-plated nickel particles of Comparative Example 2 had significantly degraded conductive resistance after the reliability test.

From the results depicted in Table 3, moreover, it was found that, the connection resistance reduced as the phosphorous concentration of the nickel plating layer reduced, by comparing the results of nickel-plated nickel particles A to F, and I.

Further, it was found from the results depicted in Table 3 that the nickel-plated nickel particles A, B, G to I, in each of which the nickel plating layer having the phosphorous concentration of 0.3% by mass to 5.1% by mass had been formed had the extremely low maximum value, i.e. lower than 2Ω, of the initial connection resistance (Ω).

Furthermore, it was found from the results depicted in Table 3 that the nickel-plated nickel particles E in each of which the nickel plating layer having the phosphorous concentration of 10.4% by mass had been formed had the resistance after the reliability test that was twice or larger than the initial value thereof.

From the results depicted in Tables 3 and 4, it was found that the nickel-plated nickel particles A to D, and G to I gave excellent connection resistance (Ω) in both the connection between the COF for evaluation and the glass substrate, and the connection between the COF for evaluation and PWB for evaluation.

Figure 3:
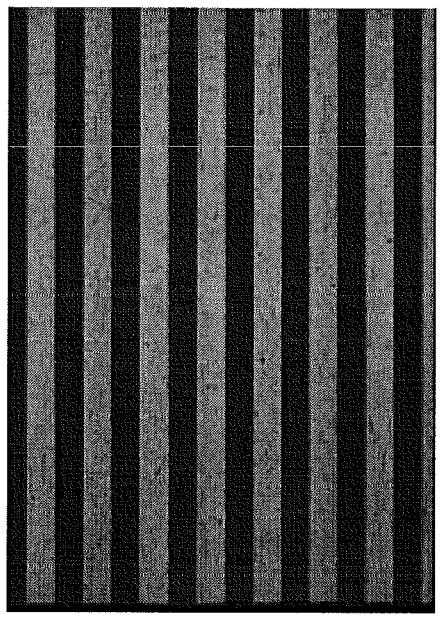
FIG. 3 is a photograph illustrating the observation result of the existence of indentations on Bonded Structure 2 in Comparative Example 1.
Figure 4:
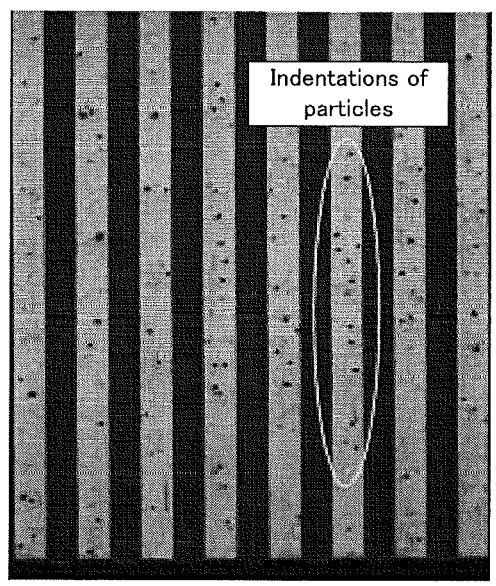
FIG. 4 is a photograph illustrating the observation result of the existence of indentations on Bonded Structure 2 in Example 1.

From FIGS. 3 and 4, it was found that there were no indentations observed on the electrode of the PWB for evaluation in the case where soft nickel-plated resin particles (FIG. 3) were used, conversely, there were indentations observed on the electrode of the PWB for evaluation in the case where the nickel-plated nickel particles were used (FIG. 4). By observing the indentations, it can be confirmed that the electrode (wiring) and the conductive particles are connected.

The conductive particles of the present invention are suitably used for connecting circuit members together, such as a connection between a liquid crystal display and a tape carrier package (TCP), a connection between a flexible printed circuit (FPC) board and TCP, and a connection between FPC and a printed wiring board (PWB).

What is claimed is:

1. A conductive particle, comprising:
    a core particle; and
    a conductive layer formed on a surface of the core particle,
    wherein the core particle is a nickel particle,
    wherein the conductive layer is a nickel plating layer a surface of which has a phosphorous concentration of 0.3% by mass to 6% by mass, and the conductive layer has an average thickness of 1 nm to 10 nm, and
    wherein the phosphorous concentration at the surface of the conductive layer is measured by energy dispersion X-ray analysis instrument.

2. The conductive particle according to claim 1, wherein the surface of the nickel plating layer has a phosphorous concentration of 0.3% by mass to 1.5% by mass.

3. The conductive particle according to claim 2, wherein the surface of the nickel plating layer has a phosphorous concentration of 0.3% by mass to 0.8% by mass.

4. The conductive particle according to claim 1, wherein the conductive particle has protrusions at a surface thereof where each protrusion has a pointed edge.

5. An anisotropic conductive film, comprising:
    conductive particles; and
    a binder resin containing an epoxy resin, an acrylate resin, and both the epoxy resin and the acrylate resin, wherein each of the conductive particles contains:

a core particle; and a conductive layer formed on a surface of the core particle, wherein the core particle is a nickel particle, wherein the conductive layer is a nickel plating layer a surface of which has a phosphorous concentration of 0.3% by mass to 6% by mass, and the conductive layer has an average thickness of 1 nm to 10 nm, and wherein the phosphorous concentration at the surface of the conductive layer is measured by energy dispersion X-ray analysis instrument.

6. The anisotropic conductive film according to claim 5, further comprising at least one selected from the group consisting of a phenoxy resin, an unsaturated polyester resin, a saturated polyester resin, and a urethane resin.

7. The anisotropic conductive film according to claim 5, further comprising a latent curing agent.

8. The anisotropic conductive film according to claim 5, further comprising a silane coupling agent.

9. A bonded structure, comprising:

a first circuit member containing an electrode;

a second circuit member containing an electrode, provided so as to face the first circuit member; and an anisotropic conductive film, provided between the first circuit member and the second circuit member, wherein the anisotropic conductive film contains:

conductive particles; and a binder resin containing an epoxy resin, an acrylate resin, and both the epoxy resin and the acrylate resin, wherein each of the conductive particles contains:

a core particle; and a conductive layer formed on a surface of the core particle, wherein the core particle is a nickel particle, wherein the conductive layer is a nickel plating layer a surface of which has a phosphorous concentration of 0.3% by mass to 6% by mass, and the conductive layer has an average thickness of 1 nm to 10 nm, wherein the electrode of the first circuit member and the electrode of the second circuit member are electrically connected via the conductive particles, and wherein the phosphorous concentration at the surface of the conductive layer is measured by energy dispersion X-ray analysis instrument.

10. The bonded structure according to claim 9, wherein the first circuit member is a flexible circuit board, and the second circuit member is a printed wiring board.

11. The bonded structure according to claim 10, wherein the electrode of the printed wiring board has indentations formed by embedding the conductive particles.

12. A bonding method, comprising:

bonding an anisotropic conductive film with a first circuit member containing an electrode, or a second circuit member containing an electrode;

aligning the first circuit member and the second circuit member for positioning; and electrically connecting the electrode of the first circuit member and the electrode of the second circuit member together via the conductive particles, wherein the anisotropic conductive film contains:

conductive particles; and a binder resin containing an epoxy resin, an acrylate resin, and both the epoxy resin and the acrylate resin, wherein each of the conductive particles contains:

a core particle; and a conductive layer formed on a surface of the core particle, wherein the core particle is a nickel particle, wherein the conductive layer is a nickel plating layer a surface of which has a phosphorous concentration of 0.3% by mass to 6% by mass, and the conductive layer has an average thickness of 1 nm to 10 nm, and wherein the phosphorous concentration at the surface of the conductive layer is measured by energy dispersion X-ray analysis instrument.

13. The bonding method according to claim 12, wherein the first circuit member is a flexible circuit board, and the second circuit member is a printed wiring board.

* * * * *